US006451114B1

United States Patent
Stevens

(10) Patent No.: US 6,451,114 B1
(45) Date of Patent: Sep. 17, 2002

(54) APPARATUS FOR APPLICATION OF CHEMICAL PROCESS TO A WORKPIECE

(75) Inventor: E. Henry Stevens, Colorado Springs, CO (US)

(73) Assignee: Quality Microcircuits Corporation, Colorado Springs, CO (US)

(*) Notice: Subject to any disclaimer, the term of this patent is extended or adjusted under 35 U.S.C. 154(b) by 0 days.

(21) Appl. No.: 09/553,676

(22) Filed: Apr. 21, 2000

Related U.S. Application Data

(60) Provisional application No. 60/130,555, filed on Apr. 22, 1999.

(51) Int. Cl.[7] .................................................. B05C 5/02
(52) U.S. Cl. ..................... 118/50; 118/52; 118/319; 118/320; 118/500; 118/730; 118/731
(58) Field of Search ............................ 118/50, 52, 319, 118/320, 500, 730, 731; 427/240

(56) References Cited

U.S. PATENT DOCUMENTS

| 6,099,702 A | * | 8/2000 | Reid et al. ..................... 118/52 |
| 6,120,609 A | * | 9/2000 | Selyutin et al. ............. 118/500 |
| 6,168,665 B1 | * | 1/2001 | Sakai et al. .................. 118/500 |
| 6,248,398 B1 | * | 6/2001 | Talieh et al. ................... 118/52 |

* cited by examiner

Primary Examiner—Laura Edwards
(74) Attorney, Agent, or Firm—William E. Hein

(57) ABSTRACT

An apparatus for application of a chemical process to a workpiece in which movement and precise location of the workpiece within the apparatus is accomplished by means of a single linear actuator and two locator components. A sequence of liquid solutions may be applied to a surface of the workpiece during processing, and a sequence of controlled atmospheres may be provided within a reaction chamber of the apparatus to thereby facilitate implementation of chemical processes that utilize both liquid-phase and gas-phase reactions in concert.

18 Claims, 6 Drawing Sheets

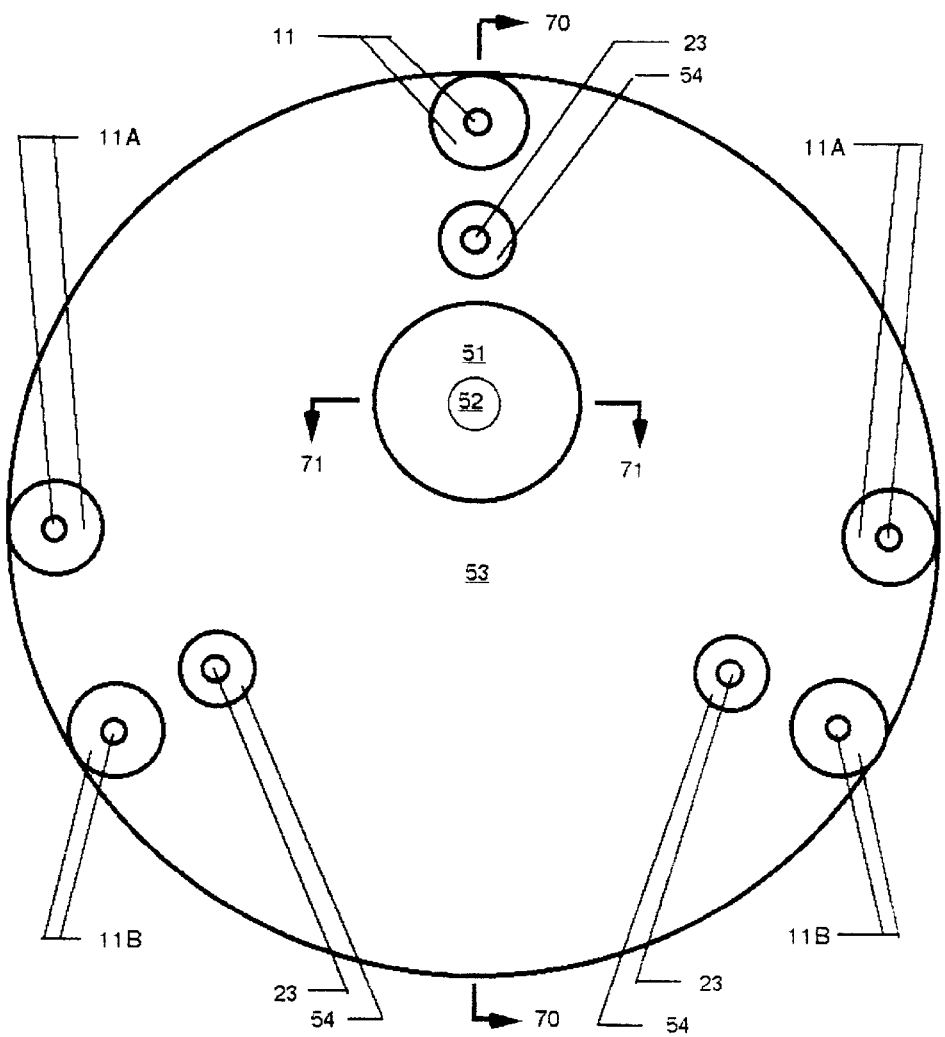
FIG. 1
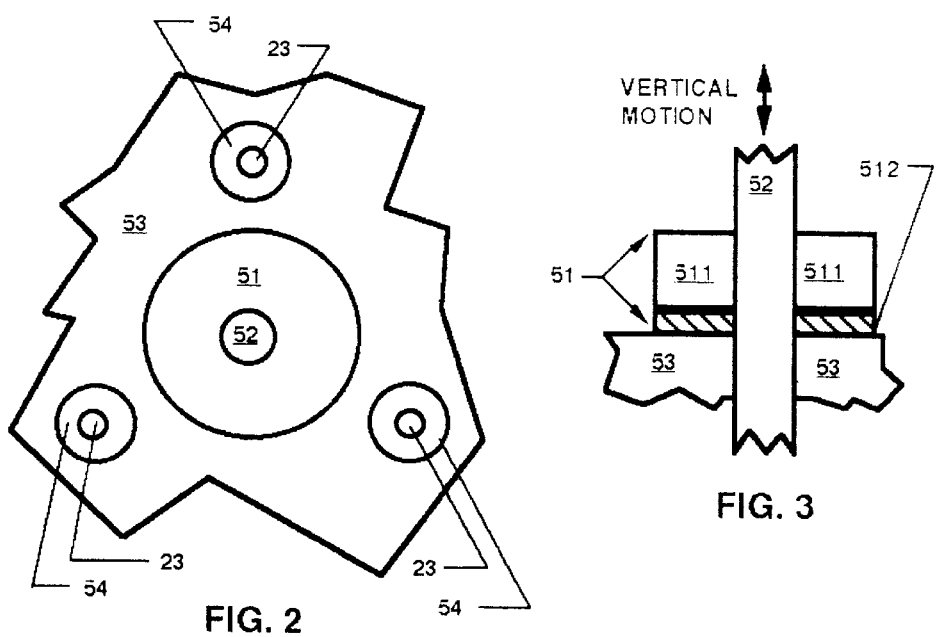
FIG. 2
FIG. 3

APPARATUS FOR APPLICATION OF CHEMICAL PROCESS TO A WORKPIECE

REFERENCE TO RELATED APPLICATION

This application claims the benefit of provisional application Serial No. 60/130,555 filed Apr. 22, 1999.

BACKGROUND OF THE INVENTION

Sequences of chemical processes that may be applied to a surface of a workpiece are limited by prior art apparatii. In one type of prior art apparatus, liquid-phase reactants are dispensed on an upper surface of the workpiece, and distribution of reactants over the surface thereof is accomplished by rotation of the workpiece at a prescribed rate. Thickness and uniformity of the film of liquid-phase reactants are determined principally by whether the liquid mixture tends to wet the workpiece surface, rotation rate, and viscosity of the liquid. In a second type of prior art apparatus, liquid-phase reactants are sprayed through one or more nozzles onto an upper or a lower surface of the workpiece. In this second type of apparatus, thickness and uniformity of the film of liquid-phase reactants are determined principally by whether the liquid mixture tends to wet the workpiece surface, the design and placement of the nozzles, rotation rate and viscosity of the liquid. It would be advantageous to provide an apparatus wherein the thickness and uniformity of liquid-phase reactant films are determined principally by features of the apparatus and wherein sequences of liquid-phase and gas-phase reactants may be applied in concert.

SUMMARY OF THE INVENTION

An apparatus for application of chemical processes to a workpiece is provided in accordance with the present invention. A first aspect of the present invention is a simple apparatus configuration that provides for movement and precise location of a workpiece within the apparatus. A second aspect of the present invention is an apparatus configuration that enables a sequence of solutions to be applied to a surface of the workpiece during processing. A third aspect of the present invention is an apparatus configuration that enables a sequence of controlled atmospheres to be provided within the apparatus chamber, thereby enabling implementation of processes that utilize liquid-phase and gas-phase reactions in concert.

BRIEF DESCRIPTION OF THE DRAWINGS

FIG. 1 is a top plan view illustrating the placement of elements and components within the apparatus of the present invention.

FIG. 2 is a diagram illustrating a portion of the top plan view of FIG. 1.

FIG. 3 is a cross-sectional view of a portion of a linear actuator assembly, taken along the line 71—71 of FIG. 1.

DETAILED DESCRIPTION OF THE PREFERRED EMBODIMENT

Figure 4:
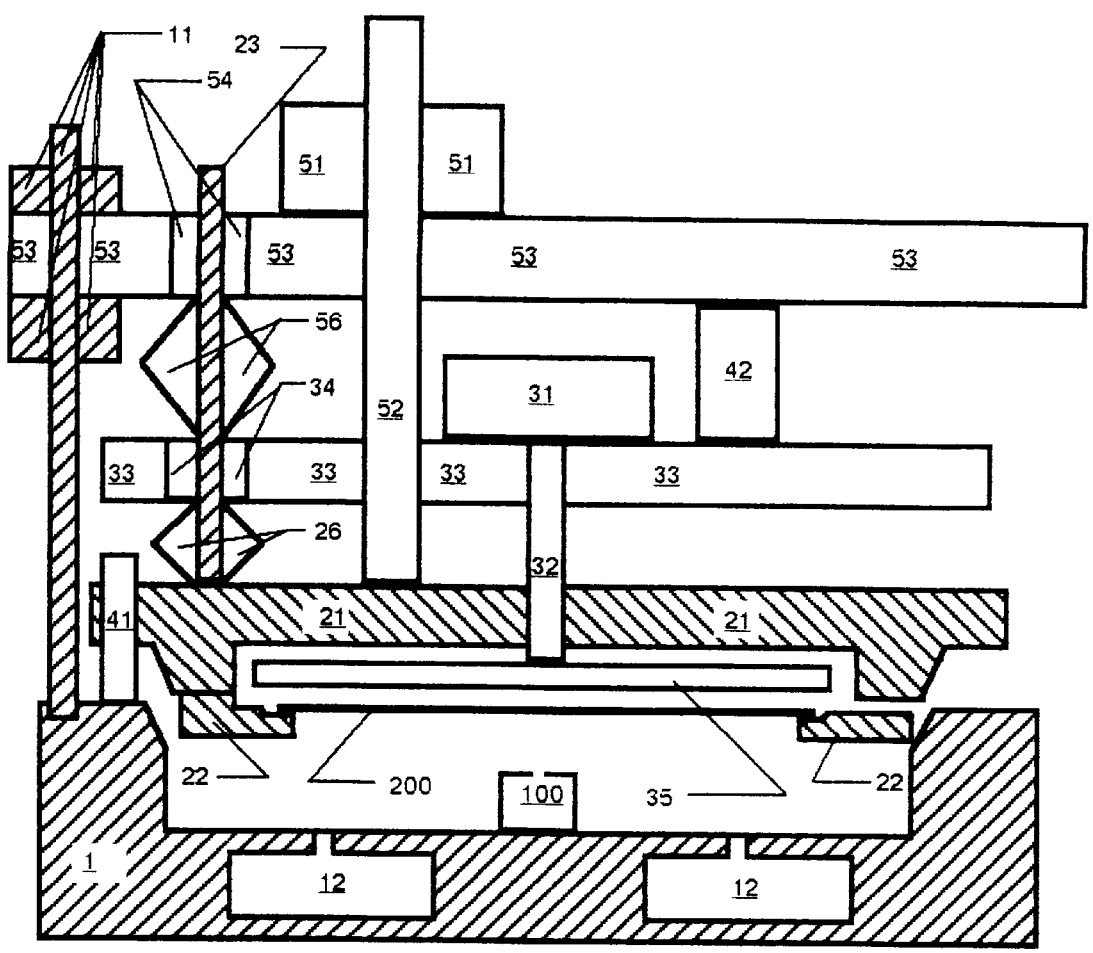
FIG. 4 is a cross-sectional view taken along the line 70—70 of FIG. 1 illustrating the apparatus of the present invention in its load-unload position.

The apparatus of the present invention may be understood with reference to the twenty appended drawing figures. Referring now to FIG. 1, there is shown a top view of the apparatus including a component mounting plate 53. Preferably, component mounting plate 53 may be formed by machining a suitable metal alloy, such as an aluminum alloy, or an iron alloy that may comprise stainless steel. Alternatively, component mounting plate 53 may be formed from a suitable plastic material, such as teflon, polyethylene or a polycarbonate. A support assembly for component mounting plate 53 may comprise a set of three elements 11, 11A or another set of three elements 11, 11B. The placement of elements 11, 11A provides adequate mechancial stability and maximum separation between the elements 11A Compared to placement of elements 11, 11A, the placement of elements 11, 11B provide improved mechanical stability and reduced separation between elements 11B. A drive mechanism 51 and a lead-screw 52 form a linear actuator assembly which may comprise, for example, one of the linear actuator assemblies manufactured and sold by Eastern Air Devices, Inc. A set of six elements 23, 54 comprise an assembly for precisely guiding vertical motion of a component assembly within the apparatus. Each element 54 preferably comprises a precision ball bushing such as one of those manufactured and sold by Thomson Industries, Inc. Each element 23 comprises a precision ground shaft formed by machining a suitable metal alloy such as a stainless steel. Placement of the elements 23, 54 around a circle that is concentric with component mounting plate 53 is illustrated in FIG. 1. Alternative placement of the elements 23, 54 around a circle that is concentric with element 52 is illustrated in FIG. 2.

Referring now to FIG. 3, there is shown a cross-sectional diagram illustrating details of a portion of the linear actuator assembly, taken along the line 71—71 of FIG. 1. An electronic control system is employed to cause rotation of a motor and drive nut assembly 511 in angular steps of, for example, 1.8 degrees. Thus, small angular steps of the drive nut are converted to small, controlled increments of vertical motion of a lead screw 52. Vertical position of an assembly attached to an end of lead screw 52 is directly related to the number of angular steps applied to the drive nut. An optional compliant mounting pad 512 may be employed with motor and drive nut assembly 511.

Referring now to FIG. 4, there is shown a cross-sectional view, taken along the line 70—70 of FIG. 1, illustrating the apparatus in its load-unload position. A base assembly 1 serves as the base of the apparatus. One or more fluid drains 12 are incorporated within the base assembly 1. A fluid application device 100 is also associated with base assembly 1. Reactant solutions are applied to a surface of the workpiece through one or more apertures in the top surface of fluid application device 100. A lid assembly of the apparatus comprises a lid element 21, and an annular ring 22 attached thereto. The lid and base assemblies incorporate matching tapered features to ensure precise alignment between the two assemblies when the lid is closed against the base. As shown at the right side of FIG. 4, a gap in the attachment between lid element 21 and annular ring 22 is provided to allow loading and unloading of a workpiece 200. Annular ring 22 serves to support workpiece 200 while it is awaiting transfer to another site. Preferably, workpiece 200 is loaded or unloaded by employing a robot device that either inserts workpiece 200 into or removes workpiece 200 from a recess provided within annular ring 22. Alternatively, workpiece 200 may be loaded or unloaded manually by employing a vacuum wand device to grip the back side of workpiece 200 during motion into or out of the apparatus. The depth of the recess provided within annular ring 22 is preferably in the range of 50% to 150% of the thickness of workpiece 200. That depth is most preferably in the range of 90% to 110% of the thickness of workpiece 200. The apparatus configuration illustrated in FIG. 4 is well suited to workpieces in the form of a circular disk, but straightforward modifications allow the apparatus concept to accommodate workpieces of other forms, such as rectangular disks. A drive disk 35 is attached to workpiece 200 to impart rotational motion thereto. A motor 31 and a drive shaft 32 comprise a drive disk assembly that is attached to a disk locating plate 33. Motor 31 is controlled by electronic circuitry to rotate drive shaft 32 at prescribed rates. Preferably, disk locating plate 33 may be formed by machining a suitable metal alloy such as an aluminum alloy or an iron alloy or an iron alloy that may comprise stainless steel, for example. Alternatively, disk locating plate 33 may be formed from a suitable plastic material such as teflon, polyethylene or a polycarbonate. A support assembly may comprise a rod 11 attached to base assembly 1 by means of welding, brazing, application of an appropriate adhesive compound, or screwing into a threaded hole provided within the base assembly. Each element 11 of the support assembly may be secured to plate 53 by means of a nut and lock washer that, when tightened, press plate 53 against a collar provided on rod 11. A locator component 41 serves to precisely locate drive disk 35 relative to the fluid application device 100. Another locator element 42 serves to precisely locate drive disk 35 relative to annular ring 22. Each shaft 23 is attached to lid element 21. A guide assembly that includes shafts 23 and precision ball bushings 54 further includes ball bushings 34 and compliant elements 26, 56.

Compliant elements 26, 56 may be in the form of a disk of a compliant material such as a plastic or rubber foam, a metal or plastic bellows, or, preferably, a spring. The lengths and stiffness constants of compliant elements 26, 56 are chosen to place drive disk 35 at a separation distance from transfer disk 22 that facilitates loading or unloading of workpiece 200 when the location of drive disk 35 is not being determined by either of locator components 41, 42. Surfaces of the apparatus that are exposed to reactants must, to an acceptable degree, not be attacked by the reactants. Depending on the reactants, preferred materials for the lid and base assembly components include one or more of the following: plastics such as polyethylene, teflon and polycarbonates, aluminum alloys, a stainless steel, and a metal or a metal alloy coated with an inert plastic such as teflon.

Figure 5:
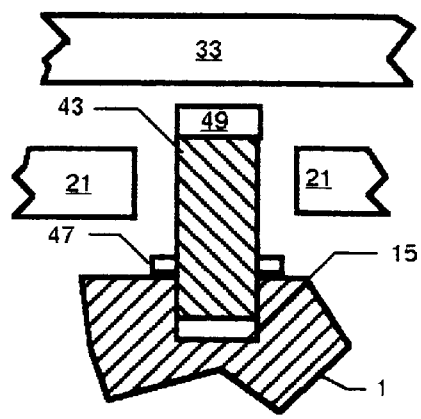
FIG. 5 is a cross-sectional diagram illustrating the details of a first locator component employed in the apparatus of FIG. 4.

Referring now to FIG. 5, there is shown a cross-sectional diagram detailing locator component 41. One or more, preferably three, of such locator components 41 are placed near the perimeter of an upper surface of base assembly 1. A threaded hole 15 is provided in base assembly 1 to receive a threaded stud 43 that is held fixed at a desired protrusion above an upper surface of base assembly 1 by a lock nut 47. Threaded stud 43 extends through a hole provided in lid element 21. An optional device 49 may be attached to an end of threaded stud 43. In one instance, device 49 may be employed to sense contact with plate 33. Contact may be sensed by applying an electric potential difference between device 49 that comprises a conductive material and a conductive element provided at the surface region of plate 33 that overlies device 49, and by then detecting the onset of an electric current. In a second instance, device 49 may be employed to both sense contact with plate 33 and to make small adjustments to the spacing between plate 33 and a surface of base assembly 1. Since it produces an electric potential difference between its upper and lower surfaces when compressed by a mechanical force, an element 49 may comprise a piezoelectric material to sense contact between device 49 and plate 33 by detecting a change in electric potential difference. Since an electric potential difference applied between its upper and lower surfaces causes a proportionate increment in the separation between its upper and lower surfaces, device 49 may comprise a piezoelectric material to also make small adjustments to the spacing between plate 33 and a surface of base assembly 1. In FIG. 5, which illustrates relative locations of components within locator component 41 when the apparatus is in its load-unload position, device 49 notably is not in contact with plate 33.

Figure 6:
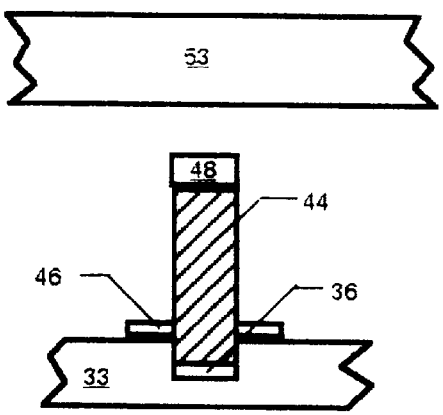
FIG. 6 is a cross-sectional diagram illustrating the details of a second locator component employed in the apparatus of FIG. 4.

Referring now to FIG. 6, there is shown a cross-sectional diagram detailing locator component 42. One or more, preferably three, of such locator components 42 are positioned on an upper surface of plate 33. A threaded hole 36 is provided in plate 33 to receive a threaded stud 44 that is held fixed at a desired protrusion above an upper surface of plate 33 by a lock nut 46. An optional device 48 may be attached to an end of threaded stud 44. In one instance, device 48 may be employed to sense contact with plate 53. Contact may be sensed by applying an electric potential difference between device 48 that comprises a conductive material and a conductive element provided at the surface region of plate 53 that overlies device 48, and by then detecting the onset of an electric current. In a second instance, device 48 may be employed to both sense contact with plate 53 and to make small adjustments to the spacing between plate 33 and plate 53. Since it produces an electric potential difference between its upper and lower surfaces when compressed by a mechanical force, device 48 may comprise a piezoelectric material to sense contact between device 48 and plate 53 by detecting a change in electric potential difference. Since an electric potential difference applied between its upper and lower surfaces causes a proportionate increment in the separation between its upper and lower surfaces, device 48 may comprise a piezoelectric material to also make small adjustments to the spacing between plate 33 and plate 53. In FIG. 6, which illustrates relative locations of components within locator component 42 when the apparatus is in its load-unload position, device 48 notably is not in contact with plate 53.

Figure 7:
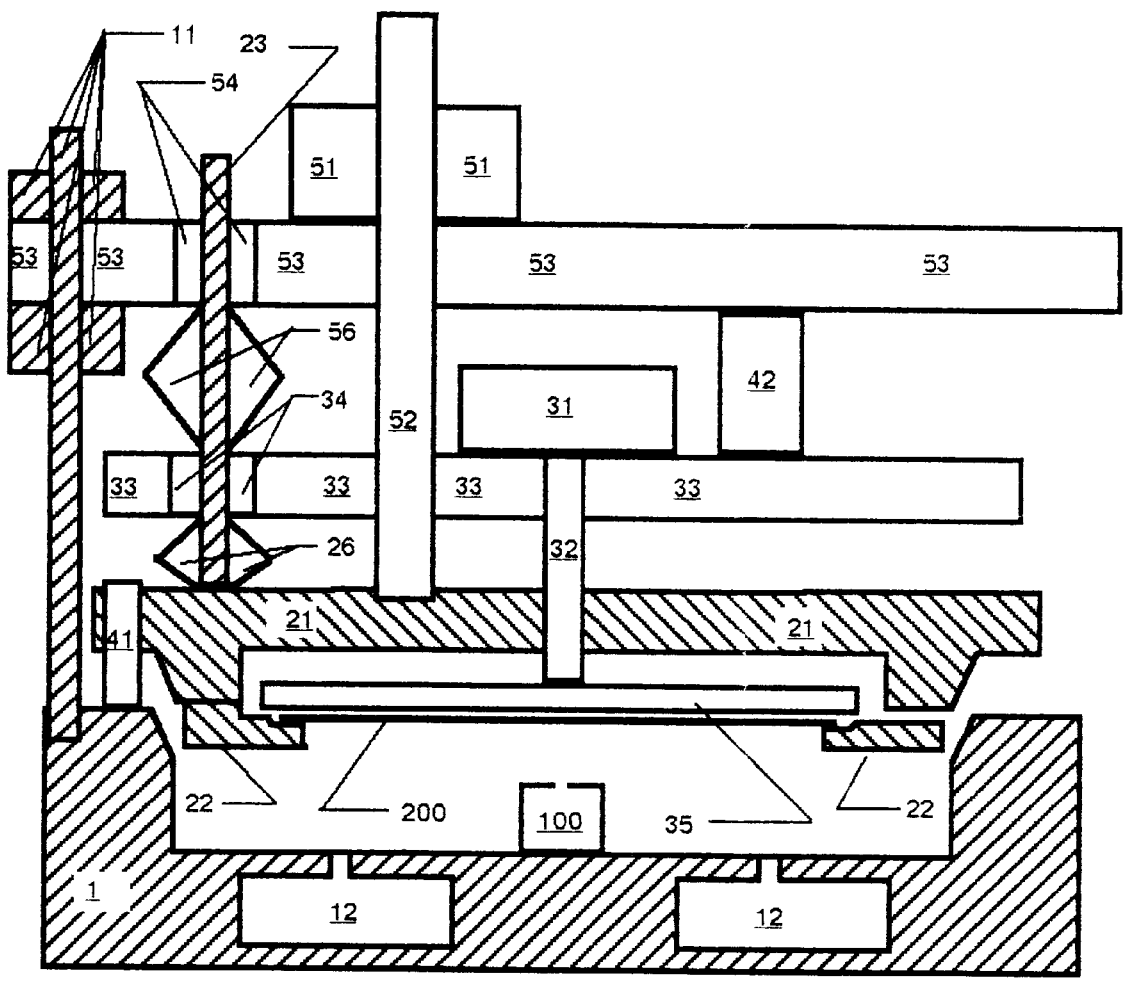
FIG. 7 is a cross-section view illustrating the apparatus of the present invention in its workpiece-transfer position.

Referring now to FIG. 7, there is shown the apparatus of the present invention in its workpiece-transfer position. In actions following loading of a workpiece into the apparatus, drive disk 35 is first brought in contact with, or in near proximity to (a separation of less than the thickness of workpiece 200), the top side of workpiece 200. Workpiece 200 is then drawn against drive disk 35 by application of a vacuum through paths provided within the drive disk assembly, thereby accomplishing transfer of workpiece 200 from a recess provided in support ring 22 to drive disk 35. In actions preceding unloading of workpiece 200, it is first brought in contact with, or in near proximity to, support ring 22. Vacuum gripping workpiece 200 against drive disk 35 is then released, thereby accomplishing transfer of workpiece 200 from drive disk 35 to a recess provided in support ring 22.

Figure 8:
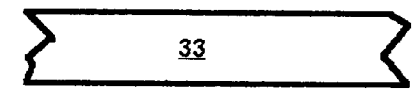
FIG. 8 is a cross-sectional diagram illustrating the details of the first locator component of FIGS. 4, 5, and 7.
Figure 8:
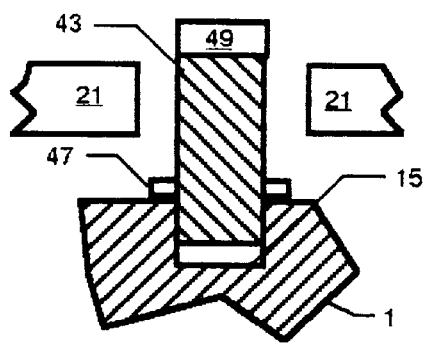
Figure 9:
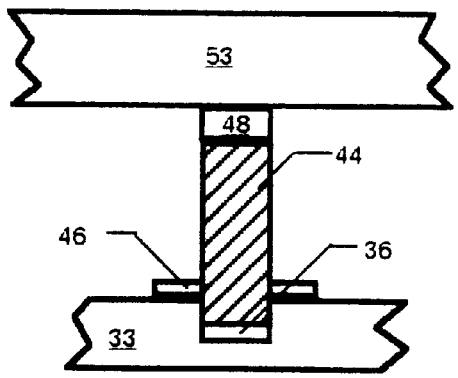
FIG. 9 is a cross-sectional diagram illustrating the details of the second locator component of FIGS. 4, 6, and 7.

The utility of locator devices 41, 42 in establishing the apparatus in its workpiece-transfer position may be understood with reference to FIGS. 8 and 9. Referring first to FIG. 8, it is noteworthy that plate 33 is not in contact with optional device 49 (or threaded stud 43 if optional device 49 is not used). Referring next to FIG. 9, it is noteworthy that spacing between plates 33 and 53 is fixed by the combined extent of threaded stud 44 and optional device 48 (or threaded stud 44 when optional device 48 is not used). Following loading of a workpiece 200, the linear actuator assembly first moves the lid assembly upward until optional device 48, (or threaded stud 44 if optional device 48 is not used) makes contact with plate 53. Compression of compliant elements 26 causes motion of the lid assembly to impart motion to plate 33 and, thereby, to drive disk 35, which is attached to plate 33 through drive disk assembly motor 31 and drive shaft 32, until motion of plate 33 is stopped by locator device 42. After the location of plate 33 has been fixed, the linear actuator then continues to move the lid assembly upward until workpiece 200 is in contact with, or in near proximity to, drive disk 35. The apparatus in now in position to effect a transfer of workpiece 200 from support ring 22 to drive disk 35. Preceding unloading of workpiece 200, the linear actuator first moves the lid assembly, plate 33, and drive disk 35 upward until optional device 48 (or threaded stud 44 if optional device 48 is not used) makes contact with plate 53, and motion of plate 33 is stopped by locator device 42. After the location of plate 33 has been fixed, the linear actuator then continues to move the lid assembly upward until workpiece 200 is in contact with, or in near proximity to, support ring 22. The apparatus in now in position to effect a transfer of workpiece 200 from drive disk 35 to support ring 22.

Figure 10:
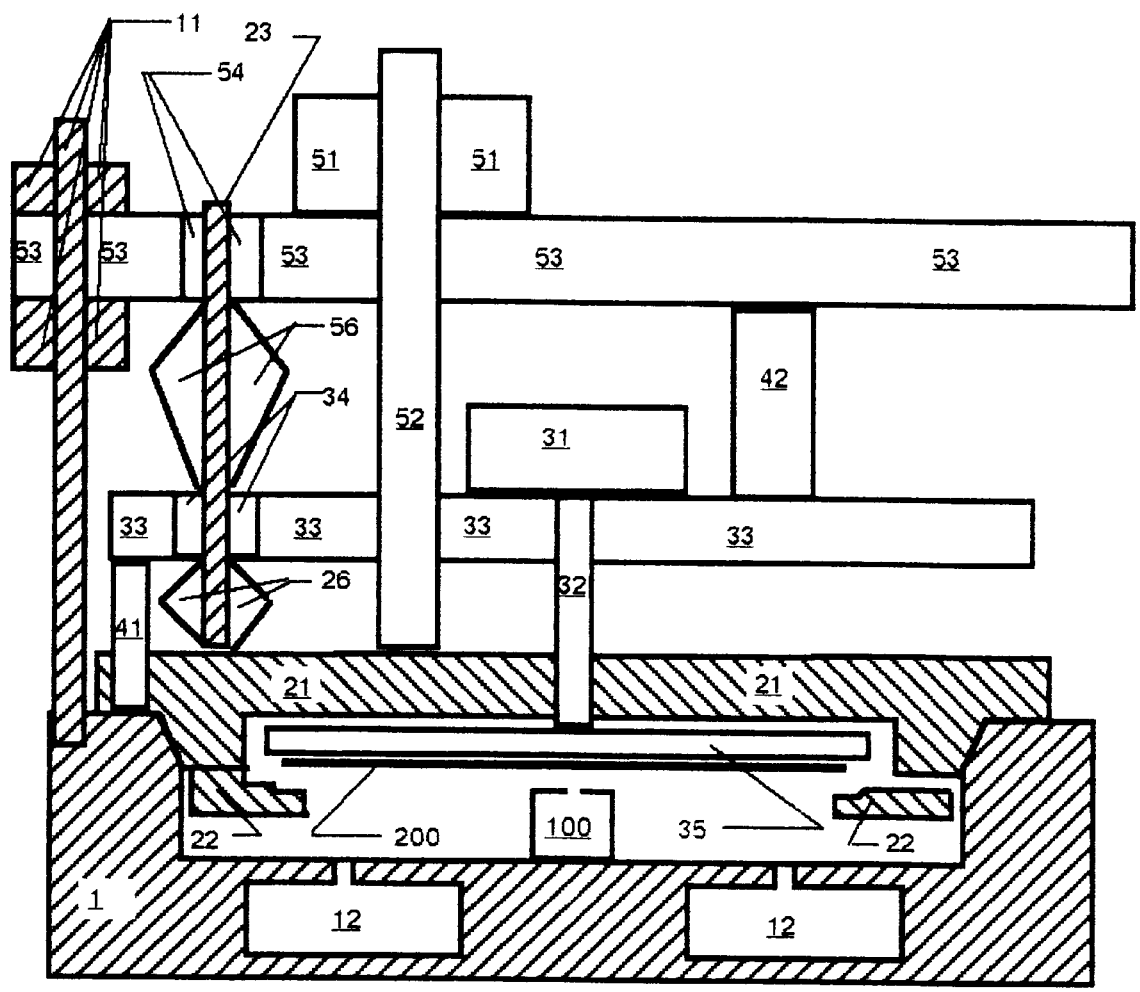
FIG. 10 is a cross-sectional view illustrating the apparatus of the present invention in its closed, processing position.

Referring now to FIG. 10, there is shown the apparatus in its closed, processing position. In actions following loading of workpiece 200 and its subsequent transfer to drive disk 35, lid element 21 is closed against base assembly 1 by vertical movement applied by lead screw 52 of the linear actuator. Matching tapered features ensure alignment of base assembly 1 and the lid assembly when the apparatus is in its closed position. In the closed position, spacing between workpiece 200 and fluid application device 100 is precisely established by locator component 41. After a prescribed spacing has been established between workpiece 200 and fluid application device 100, a prescribed rotation rate is applied to workpiece 200 by spinning drive disk 35. Then, if required by the process to be applied to workpiece 200, a controlled atmosphere is introduced into the chamber formed within the closed apparatus. Next, one or more solutions are applied to workpiece 200 in a prescribed sequence through the fluid application device 100. Typically, a process sequence ends with rinsing of workpiece 200 to remove residual reactants and reaction products by application of water, terminating the water application, and drying in an atmosphere of heated air or, if required by the process, a controlled atmosphere that may be either inert or reactive. Following completion of the processing sequence, rotation of workpiece 200 is stopped, and the apparatus is moved to its unload position by the linear actuator.

Figure 11:
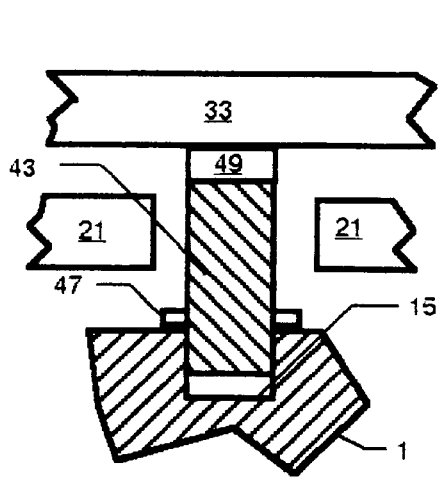
FIG. 11 is a cross-sectional diagram illustrating the details of the first locator component of FIGS. 4, 5, 7, 8, and 10.
Figure 12:
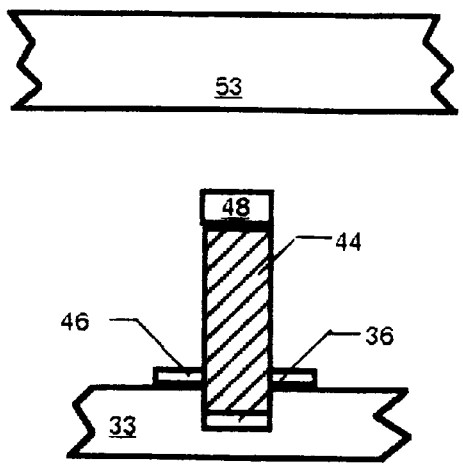
FIG. 12 is a cross-sectional diagram illustrating the details of the second locator component of FIGS. 4, 6, 7, 9, and 10.

The utility of locator devices 41, 42 in establishing the apparatus in its closed, processing position may be understood with reference to FIG. 11 and FIG. 12. Referring first to FIG. 12, it is noteworthy that plate 53 is not in contact with optional device 48 (or threaded stud 44 if optional device 48 is not used). Referring next to FIG. 11 it is noteworthy that spacing between plate 33 and base assembly 1 is fixed by the combined extent of threaded stud 43 and optional device 49 (or threaded stud 43 if optional device 49 is not used). By setting the extension of threaded stud 43, spacing between workpiece 200 and fluid application device 100 is also set, because drive disk 35 is attached to plate 33, fluid application device 100 is attached to base assembly 1, and the lid assembly closes against base assembly 1 without contacting locator device 41. When a piezoelectric device is employed as optional device 49, spacing between workpiece 200 and fluid application device 100 may be changed during a processing sequence by application of an electric potential difference between the upper and lower surfaces of optional device 49.

Incorporating contact sensing elements within locator devices 41, 42 enables precise control of vertical movements of components within the apparatus. Referring again to FIGS. 10 and 11, after sensing contact between plate 33 and optional device 49, the drive nut within drive mechanism 51 may be rotated through a number of angular increments sufficient to close lid element 21 firmly against base assembly 1 without producing excessive strains within the linear actuator. Referring again to FIGS. 7 and 9, after sensing contact between plate 53 and optional device 48, the drive nut within drive mechanism 51 may be rotated through a number of angular increments sufficient to move drive disk 35 to a set vertical spacing relative to annular ring 22. Since motion following sensing contact continues in either a downward or an upward direction, increments in vertical position after sensing contact are substantially independent of play or backlash within the linear actuator.

Figure 13:
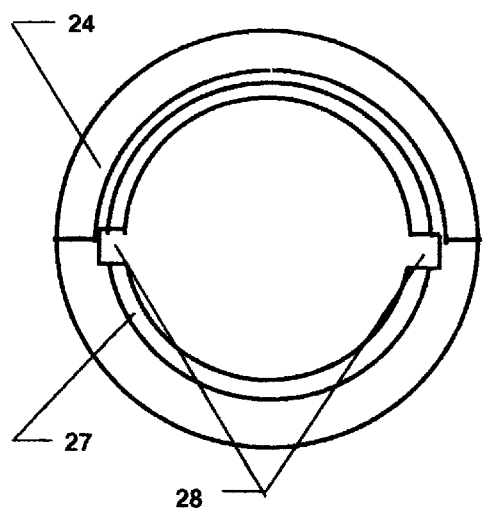
FIG. 13 is a top plan view illustrating the details of the annular ring of FIGS. 4, 7, and 10.

Referring now to FIG. 13, it may be seen that annular ring 22 comprises one-half of a section 24 of a circular cylinder, which provides spacing and attachment between annular ring 22 and lid element 21. A recess 26 in annular ring 22 facilitates centering of workpiece 200 before or after its having been transferred between annular ring 22 and drive disk 35. A pair of notches 28 allow annular ring 22 to clear fluid application device 100 when the apparatus is in its closed, processing position.

Figure 14A:
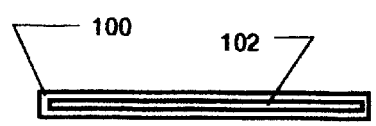
FIGS. 14A–B are top plan views illustrating the details of a portion of the fluid application device of FIGS. 4, 7, and 10.
Figure 14B:
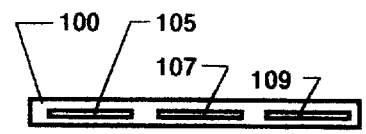

Referring now to FIG. 14A, there is shown a single fluid application slot 102 that extends substantially the full width of fluid application device 100. FIG. 14B illustrates three fluid application slots 105, 107, and 109. In general, fluids may be applied through one or more slots or apertures of other shapes, such as circular or oval shapes, with the size and placement of such one or more slots or apertures chosen to provide a desired distribution of solutions over a surface of workpiece 200. Fluids may be delivered through the one or more slots or other apertures with sufficient pressure to cause fluid jets to impinge on a surface of workpiece 200. Alternatively, fluids may be applied at low pressure by bringing a surface of workpiece 200 in contact with a meniscus of fluid that extends vertically above each of the one or more slots or other apertures.

Figure 15:
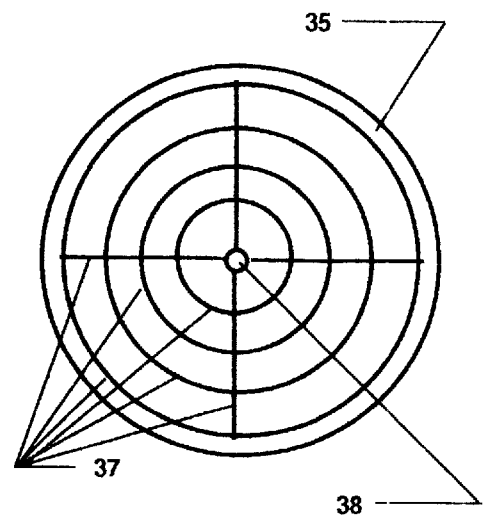
FIG. 15 is a bottom plan view illustrating the details of the drive disk of FIGS. 4, 7, and 10.

Referring now to FIG. 15, there is shown a bottom view of drive disk 35, in which a plurality of slots 37 are provided to serve as paths for distribution of a vacuum across the face of drive disk 35. Vacuum is delivered to slots 37 through an apperture 38, which extends upward through drive shaft 32 to a vacuum coupling provided within motor 31.

Figure 16:
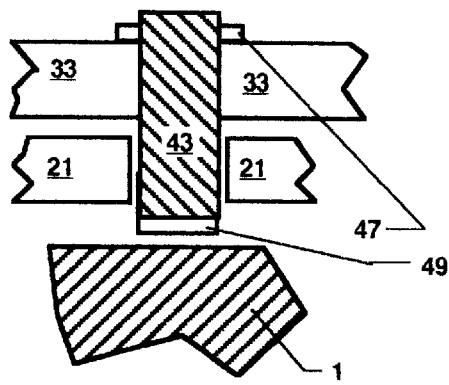
FIG. 16 is a cross-sectional diagram illustrating the details of an alternative configuration for the first locator component of FIGS. 4, 5, 7, 8, 10, and 11.

Referring now to FIG. 16, there is shown a cross-sectional diagram illustrating the details of an alternative configuration for locator device 41. A threaded hole is provided in plate 33, through which threaded stud 43 is screwed and held fixed at a desired protrusion below a lower surface of plate 33 by a lock nut 47. Optional device 49 may be attached to an end of threaded stud 43. In one instance, optional device 49 may be employed to sense contact with base assembly 1. In a second instance, optional device 49 may be employed to both sense contact with base assembly 1 and to make small adjustments to the spacing between plate 33 and base assembly 1.

Figure 17:
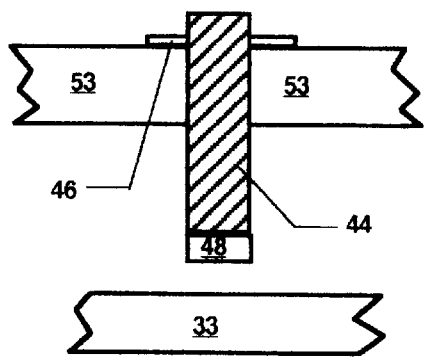
FIG. 17 is a cross-sectional diagram illustrating the details of an alternative configuration for the second locator component of FIGS. 4, 6, 7, 9, 10, and 12.

Referring now to FIG. 17, there is shown a cross-sectional diagram illustrating the details of an alternative configuration for locator device 42. A threaded hole is provided in plate 53, through which threaded stud 44 is screwed and held fixed at a desired protrusion below a lower surface of plate 53 by a lock nut 46. Optional device 48 may be attached to an end of threaded stud 44. In one instance, optional device 489 may be employed to sense contact with plate 33. In a second instance, optional device 48 may be employed to both sense contact with plate 33 and to make small adjustments to the spacing between plate 33 and plate 53.

Figure 18:
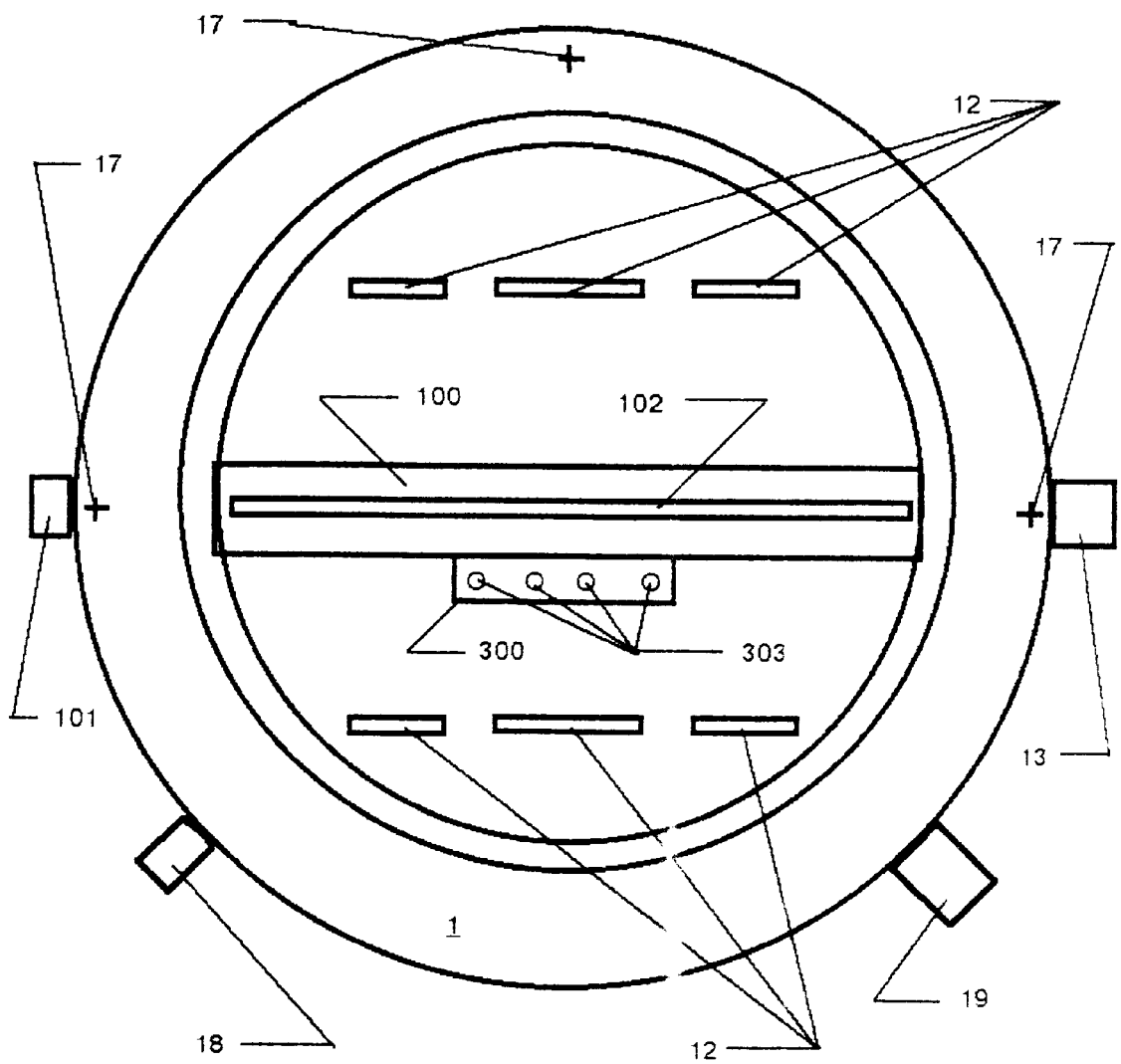
FIG. 18 is a top plan view illustrating the details of the base assembly of FIGS. 4, 7, and 10.

Referring now to FIG. 18, there is shown a top plan view of base assembly 1 having a plurality of slots 12 that connect to one or more fluid drains incorporated within base assembly 1 Fluid application device 100 is illustrated with as having a single fluid application slot 102 and a fluid input connection 101. A fluid drain connection 13 permits fluids to be either recycled through the apparatus or sent to a disposal system. A gas input connection 18 allows introduction of a controlled atmosphere within the apparatus chamber. A gas/vapor exhaust connection 19 is also provided. Sites 17 indicate the locations at which each of three support assemblies may be attached to base assembly 1. A process monitoring device 300 incorporates four sensing elements 303. In instances in which processing is being applied to a conductive film on workpiece 200 and the solution in contact with workpiece 200 is conductive, each of the sensing elements 303 may be a conductor, such as platinum, that is inert in the solution, and the sensing elements 303 may be employed to make a four-terminal resistance measurement. Since resistance is affected by the presence of an overlying conductive film on workpiece 200, measured resistance can be related to conductive film thickness and is, therefore, useful for process control functions.

Figure 19:
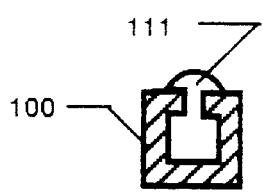
FIG. 19 is a cross-sectional diagram illustrating the details of a fluid meniscus formed above a slot or other apperture in the fluid application device of FIGS. 4, 7, 10, 14A–B, and 18.

Referring now to FIG. 19, there is shown a cross-section diagram of a fluid meniscus 111 formed above a slot or other aperture in fluid application device 100.

Figure 20:
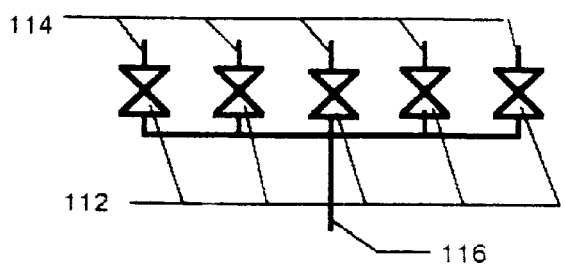
FIG. 20 is a schematic diagram of a manifold device that may be employed to deliver a sequence of solutions to an input connection of the base assembly of FIG. 18.

Referring now to FIG. 20, there is shown a schematic diagram of a manifold device that may be employed to deliver a sequence of solutions to fluid input connection 101 of FIG. 18. Such a manifold device may also be employed to effect fluid mixtures. A similar manifold configuration may be employed to deliver a sequence of gases or gas mixtures to the input connection 18 of FIG. 18. Referring again to FIG. 20, a plurality of tubes or pipes 114 are formed of a suitable material and extend to supply reservoirs for process solutions or gases. A tube or pipe 116 is also formed of a suitable material and makes connection with fluid input connection 101 of FIG. 18 in the instance in which the manifold device is being utilized to deliver solutions. Tube or pipe 116 is connected to input connection 18 of FIG. 18 in the instance in which the manifold device is being utilized to deliver gases. A plurality of valves 112, illustrated in FIG. 20, may comprise any reasonable number of two or more valves that are actuated either manually, pneumatically, or electrically.

The apparatus of the present invention offers both simplicity of operation and great flexibility in implementation of chemical processes. Movement and precise location of a workpiece within the apparatus is accomplished with a single linear actuator and two locating components. A sequence of solutions may be applied to a surface of workpiece 200 during processing. A sequence of controlled atmospheres may be provided within the apparatus chamber. Thus, the apparatus of the present invention enables implementation of chemical processes that utilize liquid-phase and gas-phase reactions in concert.

I claim:

1. An apparatus for application of a chemical process to a workpiece, the apparatus comprising:

means for establishing the apparatus in a configuration that facilitates loading of said workpiece into the apparatus;

means for establishing the apparatus in a configuration that provides a reaction chamber enclosing said workpiece;

means, cooperating with said means for establishing the apparatus in a configuration that provides a reaction chamber enclosing said workpiece, for providing a sequence of gas mixtures within said reaction chamber;

a fluid application device, positioned within said reaction chamber, for applying liquids to a surface of said workpiece;

means coupled to said fluid application device for providing a sequence of liquid solutions to said fluid application device;

means coupled to said workpiece for imparting rotational motion to said workpiece when it is within said reaction chamber;

one or more locating components within said reaction chamber for establishing a desired separation between said fluid application device and said workpiece, said one or more locating components being operative for adjusting said desired separation while said workpiece is within said reaction chamber; and means for establishing the apparatus in a configuration that facilitates unloading of said workpiece from the apparatus, said means for establishing the apparatus in a configuration that facilitates unloading of said workpiece from the apparatus cooperating with said means for establishing the apparatus in a configuration that facilitates loading of said workpiece into the apparatus.

2. An apparatus for application of a chemical process to a workpiece as in claim 1, wherein said fluid application device includes one or more apertures, said means for providing a sequence of liquid solutions to said fluid application device causes a meniscus of liquid to extend from each of said one or more apertures in said fluid application device, and said one or more locating components provide a means for establishing a separation between said workpiece and said fluid application device to thereby cause a surface of said workpiece to be in contact with said meniscus of liquid.

3. An apparatus for application of a chemical process to a workpiece as in claim 2, wherein said one or more locating components are operative for establishing a separation between said workpiece and said fluid application device that is less than one-half of an amount by which said meniscus of liquid extends from said one or more apertures in said fluid application device before contact is made between said meniscus of liquid and said surface of said workpiece.

4. An apparatus for application of a chemical process to a workpiece as in claim 2, wherein said one or more apertures comprises a single slot in an upper surface of said fluid application device, the length of the slot being in the range of 90 to 110 percent of a diameter of said workpiece.

5. An apparatus for application of a chemical process to a workpiece as in claim 1, wherein said one or more locating components include means for adjusting said desired separation between said fluid application device and said workpiece while a sequence of liquid solutions is being applied to said surface of said workpiece.

6. An apparatus for application of a chemical process to a workpiece as in claim 1, wherein each of said one or more locating components incorporates a piezoelectric element for adjusting said desired separation between said fluid application device and said workpiece while a sequence of liquids is being applied to said surface of said workpiece.

7. An apparatus for application of a chemical process to a workpiece as in claim 1, wherein each of said one or more locating components comprises a stud that is attached at one end thereof to a base of the apparatus, said stud incorporating a piezoelectric element at another end thereof.

8. An apparatus for application of a chemical process to a workpiece as in claim 7, wherein said piezoelectric element is operative for developing an electric potential difference for detecting contact between said one or more locating components and another component of said apparatus.

9. An apparatus for application of a chemical process to a workpiece as in claim 7, further comprising means for applying a potential difference to said piezoelectric element for adjusting separation between said fluid application device and said surface of said workpiece while a sequence of liquid solutions is being applied to said surface of said workpiece.

10. An apparatus for application of a chemical process to a workpiece as in claim 1, wherein said means for imparting rotational motion to said workpiece comprises a drive disk attached to said workpiece, a shaft coupled to said drive disk, a disk locating plate, and a motor mounted on said disk locating plate, said disk locating plate being operative with said one or more locating components to establish said desired separation between said fluid application device and said surface of said workpiece.

11. An apparatus for application of a chemical process to a workpiece as in claim 10, wherein each of said one or more locating components comprises a stud that is attached to a base of the apparatus at its one end and that incorporates a piezoelectric element at its other end.

12. An apparatus for application of a chemical process to a workpiece as in claim 11, wherein said piezoelectric element is operative for developing an electric potential difference for detecting contact between each of said one or more locating components and said disk locating plate.

13. An apparatus for application of a chemical process to a workpiece as in claim 11, further comprising means for applying a potential difference to said piezoelectric element for adjusting separation between said fluid application device and said surface of said workpiece while a sequence of liquid solutions is being applied to said surface of said workpiece.

14. An apparatus for application of a chemical process to a workpiece as in claim 10, wherein each of said one or more locating components comprise a stud that is attached to said disk locating plate at one end thereof, said stud incorporating a piezoelectric element at another end thereof.

15. An apparatus for application of a chemical process to a workpiece as in claim 14, wherein said piezoelectric element is operative for developing an electric potential difference for detecting contact between each of said one or more locating components and a base of said apparatus.

16. An apparatus for application of a chemical process to a workpiece as in claim 14, further comprising means for applying an electric potential difference to said piezoelectric element for adjusting separation between said fluid application device and said surface of said workpiece while a sequence of liquid solutions is being applied to said surface of said workpiece.

17. An apparatus for application of a chemical process to a workpiece as in claim 11, wherein said one or more locating components comprise three locating components.

18. An apparatus for application of a chemical process to a workpiece as in claim 1, further comprising a single linear actuator, operative in conjunction with said one or more locating components, for establishing said apparatus in each of its said configurations.

* * * * *